United States Patent
Nowak et al.

(10) Patent No.: US 10,312,649 B2
(45) Date of Patent: Jun. 4, 2019

(54) PHANTOM POWERED PREAMP CONVERTER

(71) Applicant: PCB Piezotronics, Inc., Depew, NY (US)

(72) Inventors: Mark Nowak, West Seneca, NY (US); Andrew Karkau, Wilson, NY (US)

(73) Assignee: PCB Piezotronics, Inc., Depew, NY (US)

( * ) Notice: Subject to any disclaimer, the term of this patent is extended or adjusted under 35 U.S.C. 154(b) by 0 days.

(21) Appl. No.: 15/942,102

(22) Filed: Mar. 30, 2018

(65) Prior Publication Data

US 2018/0287321 A1  Oct. 4, 2018

Related U.S. Application Data

(60) Provisional application No. 62/478,782, filed on Mar. 30, 2017.

(51) Int. Cl.
*H05K 5/04* (2006.01)
*H04R 1/04* (2006.01)
(Continued)

(52) U.S. Cl.
CPC ........... *H01R 31/065* (2013.01); *H03F 3/183* (2013.01); *H04R 3/00* (2013.01); *H05K 5/0217* (2013.01);
(Continued)

(58) Field of Classification Search
CPC .... H01R 31/065; H01R 13/623; H01R 13/08; H04R 3/00; H03F 3/183; H03F 2200/03; H05K 5/04; H05K 5/0217; H05K 7/1427
(Continued)

(56) References Cited

U.S. PATENT DOCUMENTS 3,718,862 A  2/1973 Norris
7,072,478 B2  7/2006 Hohendahl
(Continued)

FOREIGN PATENT DOCUMENTS

CN  201298916 Y  8/2009
GB  2488182 A  8/2012
(Continued)

OTHER PUBLICATIONS

PCT/US2018/025504 International Seach Report and Written Opinion, dated 2018.*
(Continued)

*Primary Examiner* — Ahmad F. Matar
*Assistant Examiner* — Sabrina Diaz
(74) *Attorney, Agent, or Firm* — Alfred Y. Chu, Esq.; Michael J. Berchou, Esq.; Harter Secrest & Emery LLP

(57) ABSTRACT

A phantom powered preamp for use with a microphone cartridge having a unique mechanical interface. The unique mechanical interface allows the phantom powered preamp to function with both ¼ and ½ inch microphone cartridges. The phantom powered preamp including a housing base having a PC board assembly and a connector, the PC board assembly being electrically coupled to the connector; a preamp tip having an adapter and a guard tube, the PC board assembly extending from the housing base to the preamp tip and being electrically coupled to the adapter and the guard tube, the adapter being configured to be electrically coupled to the microphone cartridge, the guard tube being configured to surround a portion of the PC board assembly within the preamp tip; and a first converter being configured to releasably engage the preamp tip or the housing base to reduce edge diffraction.

20 Claims, 3 Drawing Sheets

(51) Int. Cl.
  *H01R 31/06* (2006.01)
  *H04R 3/00* (2006.01)
  *H03F 3/183* (2006.01)
  *H05K 7/14* (2006.01)
  *H05K 5/02* (2006.01)
  *H01R 13/08* (2006.01)
  *H01R 13/623* (2006.01)

(52) U.S. Cl.
  CPC .............. *H05K 5/04* (2013.01); *H05K 7/1427* (2013.01); *H01R 13/08* (2013.01); *H01R 13/623* (2013.01); *H03F 2200/03* (2013.01)

(58) Field of Classification Search
  USPC ........................................................ 381/120
  See application file for complete search history.

(56) References Cited

U.S. PATENT DOCUMENTS

| | | | |
|---|---|---|---|
| 8,265,304 B2 | 9/2012 | Osborne | |
| 8,433,090 B1 | 4/2013 | Cloud et al. | |
| 9,257,944 B2 | 2/2016 | Eriksson | |
| 9,306,519 B1 | 4/2016 | Cloud | |
| 2005/0254670 A1 | 11/2005 | Akino | |
| 2006/0013428 A1* | 1/2006 | Akino | H04R 19/04 381/369 |
| 2006/0078134 A1* | 4/2006 | Khenkin | H04R 3/00 381/113 |
| 2008/0279408 A1* | 11/2008 | Matsui | H04R 1/08 381/363 |
| 2011/0135118 A1 | 6/2011 | Osborne | |
| 2011/0206221 A1 | 8/2011 | Yoshino | |
| 2015/0043747 A1* | 2/2015 | Barham | H04R 1/28 381/98 |
| 2015/0333429 A1 | 11/2015 | Akino | |
| 2017/0295429 A1* | 10/2017 | Poletti | H04R 5/027 |

FOREIGN PATENT DOCUMENTS

| | | |
|---|---|---|
| JP | 2006033463 A | 2/2006 |
| WO | 2016171551 A1 | 10/2016 |

OTHER PUBLICATIONS

GRAS Sound & Vibration A/S, G.R.A.S. RA0019, "Adapter for 1/4" microphone and 1/2" preamplifier". retrieved from http://www.gras.dk/ra0019.html, Feb. 8, 2017 (1 page).

GRAS Sound & Vibration A/S, G.R.A.S. RA0082, "Adapter for 1/4" microphone and 1/2" preamplifier". retrieved from http://www.gras.dk/ra0082.html, Feb. 8, 2017 (1 pages).

International Standard, International Electrotechnical Commission 61076-2-103, ISBN 2-8318-7438-6, First Edition, Mar. 2004 (72 pages).

International Standard, International Electrotechnical Commission 61938, Edition 2.0, Jun. 2013 (76 pages).

* cited by examiner

PHANTOM POWERED PREAMP CONVERTER

BACKGROUND OF THE INVENTION

Field of the Invention

The present invention relates generally to preamplifiers for microphone testing and measurement, and more specifically to an improved phantom powered preamp for microphone test and measurement.

Description of Related Art

Phantom power may be sourced from a special power supply or any other equipment with phantom powering circuitry such as mixers and amplifiers commonly used in the audio recording industry. Phantom power provides DC electric power to the electronics of the microphone system. IEC 61938, incorporated herein by reference, provides internationally recognized standards for phantom power systems.

Phantom powering consists of a phantom circuit where direct current is applied equally through the two signal lines of a balanced audio connector (e.g., both pins 2 and 3 of an XLR connector). The supply voltage is referenced to the ground pin of the connector (e.g., pin 1 of an XLR), which may be connected to the cable shield or a ground wire in the cable or both. When phantom powering was introduced, one of its advantages was that the same type of balanced, shielded microphone cable that studios were already using for dynamic microphones could be used for condenser microphones. Other microphones require special, multi-conductor cables.

Traditional preamp/adapter combinations require a guard to be extended through the adapter to effectively reduce parasitic capacitance. Moreover, reduced acoustic diffraction effects are due to the simplified geometry of a complete system. Designs that use standard adapters to interface the microphone to the preamp introduce diameter changes (e.g., edges or slopes) that degrade acoustic performance.

BRIEF SUMMARY OF THE INVENTION

An embodiment of the present disclosure provides for a phantom powered preamp for use with a microphone cartridge having a unique mechanical interface. The novel phantom powered preamp includes in certain aspects a housing base having a PC board assembly and a connector, the PC board assembly being electrically coupled to the connector; a preamp tip having an adapter and a guard tube, the PC board assembly extending from the housing base to the preamp tip and being electrically coupled to the adapter and the guard tube, the adapter being configured to be electrically coupled to the microphone cartridge, the guard tube being configured to surround a portion of the PC board assembly within the preamp tip; and a first converter being configured to releasably engage the preamp tip or the housing base to reduce edge diffraction.

Another embodiment of the present disclosure provides for a phantom powered preamp for use with a microphone cartridge having a unique mechanical interface. The novel phantom powered preamp includes in certain aspects a housing base having a PC board assembly and a connector, the PC board assembly being electrically coupled to the connector; a preamp tip having an adapter and a guard tube, the PC board assembly extending from the housing base to the preamp tip and being electrically coupled to the adapter and the guard tube, the adapter being configured to be electrically coupled to the microphone cartridge, the guard tube being configured to surround a portion of the PC board assembly within the preamp tip, wherein the housing base and the preamp tip are a unitary structure; and a converter being configured to releasably engage the preamp tip or the housing base to reduce edge diffraction.

Yet another embodiment of the present disclosure provides for a phantom powered preamp for use with a microphone cartridge having a unique mechanical interface. The novel phantom powered preamp includes in certain aspects a housing base having a PC board assembly and a connector, the PC board assembly being electrically coupled to the connector; a preamp tip having an adapter and a guard tube, the PC board assembly extending from the housing base to the preamp tip and being electrically coupled to the adapter and the guard tube, the adapter being configured to be electrically coupled to the microphone cartridge, the guard tube being configured to surround a portion of the PC board assembly within the preamp tip; a first converter having a distal end having a first diameter; and a second converter having a distal end having a second diameter greater than the first diameter of the first converter, the first converter and the second converter being configured to interchangeably engage the preamp tip or the housing base.

A further embodiment is disclosed wherein the phantom powered preamp includes some or all of the following: the adapter being a pogo adapter; further comprising at least one support bracket connected to the PC board assembly; the at least one support bracket being connected to the PC board assembly by at least one screw; the guard tube being made of metal or an electrically conductive material; the guard tube being further configured to surround the adapter of the preamp tip; the preamp tip further including a microphone interface; the preamp tip further including an inner insulator and an outer insulator, the inner insulator electrically insulating the adapter from the guard tube, the outer insulator electrically insulating the guard tube from the preamp tip; the housing base further including a spring, the spring being positioned at an opposite end of the connector of the housing base; the spring is configured to carry a ground connection to the housing base; the first converter being one of a ¼ inch converter and a ½ inch converter; the ¼ inch converter tapering at an angle; the housing base including a distal end and a proximal end, the distal end of the housing base sloping at an angle forming a tapered distal end; the angle of the ¼ inch converter and the angle of the distal end of the housing base being approximately the same angle; a distal end of the first converter is configured to be releasably engaged to the microphone cartridge; the ½ inch converter being cylindrical in shape; the preamp tip including a distal end and a proximal end, the proximal end of the preamp tip being proximate to the housing base, the proximal end of the preamp tip including threads for receiving the first converter; the first converter having a distal end having a first diameter, further comprising a second converter having a distal end having a second diameter greater than the first diameter, wherein the first converter and the second converter are configured to interchangeably engage the preamp tip; and the housing base and the preamp tip being a unitary structure.

BRIEF DESCRIPTION OF THE SEVERAL VIEWS OF THE DRAWINGS

The accompanying drawings, which are included to provide further understanding of the present invention disclosed in the present disclosure and are incorporated in and constitute a part of this specification, illustrate aspects of the present invention and together with the description serve to explain the principles of the present invention. In the drawings.

DETAILED DESCRIPTION OF THE INVENTION

Figure 1:
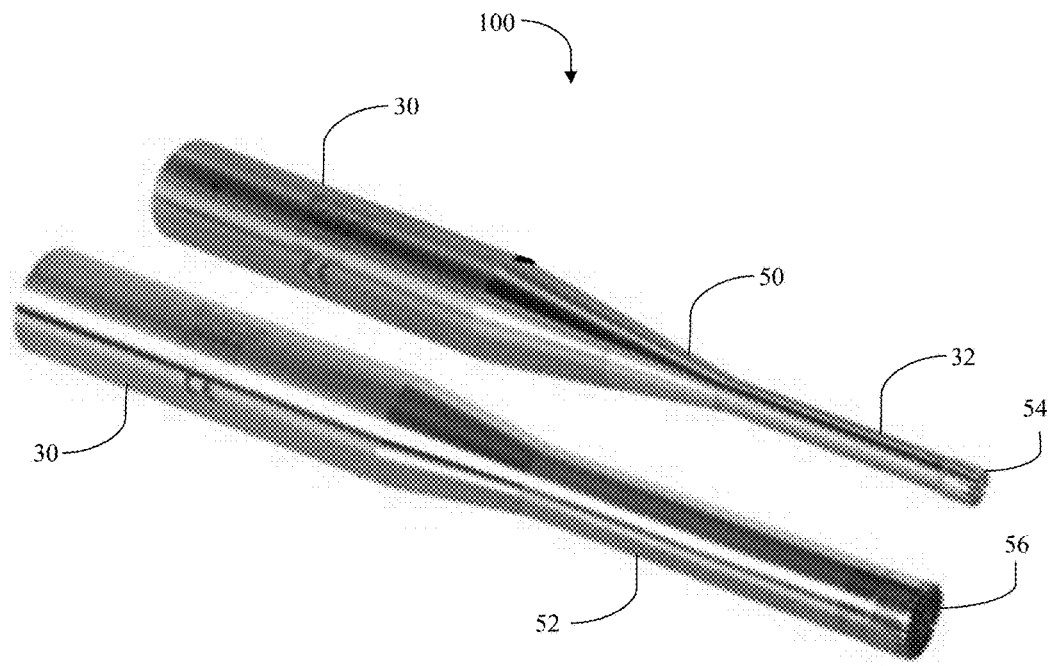
FIG. 1 is a perspective view of a first phantom powered preamp configured for a ½ inch microphone and a second phantom powered preamp configured for a ¼ inch microphone.
Figure 2:
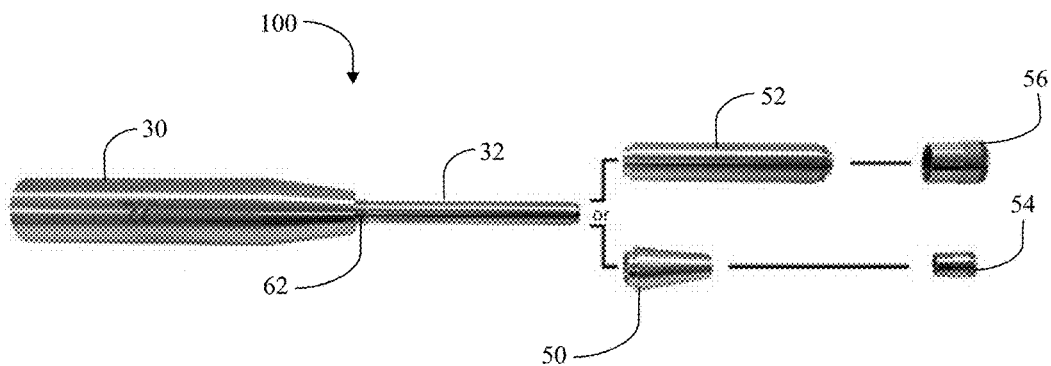
FIG. 2 is a perspective top view of a phantom powered preamp for use with a ½ inch microphone or a ¼ inch microphone.

The detailed description set forth below is intended as a description of various configurations of the present invention and is not intended to represent the only configurations in which the present invention may be practiced. It will be apparent, however, to those of ordinary skill in the art that the present invention is not limited to the specific details set forth herein and may be practiced without these specific details.

It is to be appreciated that the present teaching is by way of example only, not by limitation. The concepts herein are not limited to use or application with a specific system or method. Thus, although the instrumentalities described herein are for the convenience of explanation, shown and described with respect to exemplary embodiments, it will be appreciated that the principles herein may be applied equally in other types of systems and methods.

At the outset, it should be clearly understood that like reference numerals are intended to identify the same structural elements, portions or surfaces consistently throughout the several drawing figures, as such elements, portions or surfaces may be further described or explained by the entire written specification, of which this detailed description is an integral part. Unless otherwise indicated, the drawings are intended to be read (e.g., cross-hatching, arrangement of parts, proportion, degree, etc.) together with the specification, and are to be considered a portion of the entire written description of this invention. As used in the following description, the terms "horizontal", "vertical", "left", "right", "up" and "down", as well as adjectival and adverbial derivatives thereof (e.g., "horizontally" "rightwardly", "upwardly", etc.), simply refer to the orientation of the illustrated structure as the particular drawing figure faces the reader. Similarly, the terms "inwardly" and "outwardly" generally refer to the orientation of a surface relative to its axis of elongation, or axis of rotation, as appropriate.

Referring to FIGS. 1-6, the present invention is described as a phantom powered preamp 100 that may use phantom power from a power source. In certain embodiments, the present invention may allow the phantom powered preamp 100 to connect to different sizes of precision condenser microphones (e.g., ½ inch microphone 56 and ¼ inch microphone 54). This allows the phantom powered preamp 100 to provide a wide frequency range, a wide range of inherent noise, maximum sound pressure level, sensitivity, and microphone sound field response types (e.g., free-field, random incidence, and pressure) for microphone systems using the phantom powered preamp 100. Table 1 provides example configurations/specifications that may be achieved with selected microphone cartridges 54, 56 along with the phantom powered preamp 100.

TABLE 1

| Performance | | | |
| --- | --- | --- | --- |
| Nominal Microphone Diameter | ½" | ½" | ¼" |
| Frequency Response Characteristic | Free Field | Free Field | Free Field |
| Sensitivity (at 250 Hz) | 12.6 mV/Pa (±2 dB) | 50 mV/Pa (±1.5 dB) | 2 mV/Pa (±3 dB) |
| Frequency Range (±1 dB) | 5 Hz to 16.000 Hz | 5 Hz to 10.000 Hz | 7 Hz to 12.500 Hz |
| Frequency Range (±2 dB) | 3.15 Hz to 31.500 Hz | 3.15 Hz to 20.000 Hz | 5 Hz to 80.000 Hz |
| Frequency Range (±3 dB) | 3.15 Hz to 40.000 Hz | — | 4 Hz to 100.000 Hz |
| Lower Limiting Frequency (−3 dB) | 1 Hz to 3 Hz | 1 Hz to 3 Hz | 0.75 Hz to 4 Hz |
| Dynamic Range (3% Distortion Limit) | 150 dB re 20 µPa | 137 dB re 20µPa | 164 dB re 20 µPa |
| Inherent Noise (Typical) | 22.5 dB(A) re 20 µPa | 15.5 dB(A) re 20µPa | 40 dB(A) re 20 µPa |
| Performance | | | |
| Nominal Microphone Diameter | ½" | ¼" | ½" |
| Frequency Response Characteristic | Pressure | Pressure | Random Incidence |
| Sensitivity (at 250 Hz) | 12.6 mV/Pa (±2 dB) | 1 mV/Pa (±3 dB) | 50 mV/Pa (±1.5 dB) |
| Frequency Range (±1 dB) | 4 Hz to 12.500 Hz | — | 7 Hz to 6.300 Hz |
| Frequency Range (±2 dB) | 3.15 Hz to 20.000 Hz | 7 Hz to 70.000 Hz | 3.75 Hz to 16.000 Hz |
| Frequency Range (±3 dB) | — | — | — |
| Lower Limiting Frequency (−3 dB) | 1 Hz to 2.4 Hz | 0.75 Hz to 4 Hz | 1 Hz to 3 Hz |
| Dynamic Range (3% Distortion Limit) | 150 dB re 20 µPa | 173 dB re 20 µPa | 137 dB re 20 µPa |
| Inherent Noise (Typical) | 22 dB(A) re 20 µPa | 50 dB(A) re 20 µPa | 16 dB(A) re 20 µPa |

The phantom powered preamp 100 may provide durability and flexibility by being configured to be operable with the precision condenser microphones manufactured by PCB Piezotronics (e.g., Model Nos. 377B02, 377A06, and 377C01) and prepolarized condenser microphones manufactured by others with the same or similar mating/mounting geometry. This may allow the phantom powered preamp 100 to be operated with equipment commonly used in the audio industry, such as mixing boards or studio microphone preamplifiers, e.g., the Millennia Media HV-3C.

In one embodiment, the phantom powered preamp 100 may include a housing base 30 that may house electrical components of the phantom powered preamp 100 and a preamp tip 32 that may further house the electrical components of the phantom powered preamp 100 and a mechanical microphone interface (e.g., ¼ inch microphone interface 58 and ½ inch microphone interface 60). The preamp tip 32 may be an extension of or connected to the housing base 30 of the phantom powered preamp 100.

Figure 4:
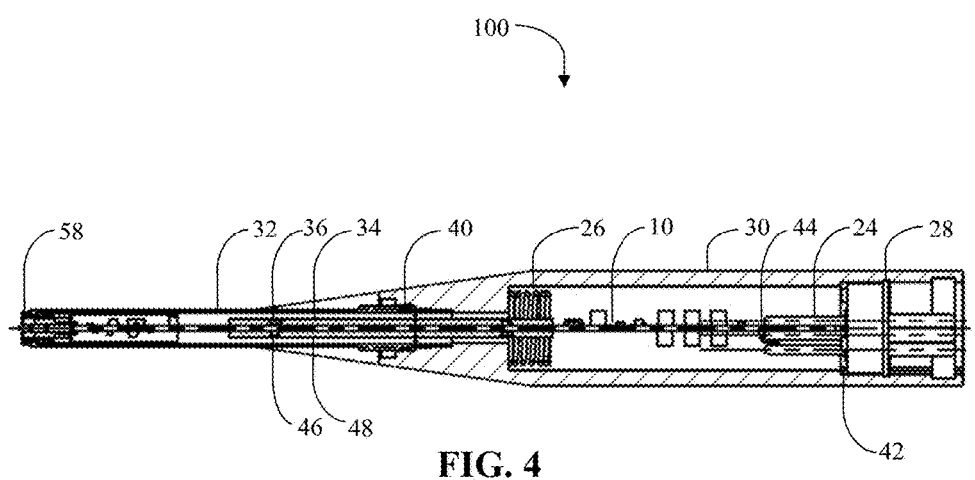
FIG. 4 is a cross-sectional view of the phantom powered preamp.

As illustrated in FIG. 4, the housing base 30 of the phantom powered preamp 100 may include PC board assembly 10 (which may extend into the preamp tip 32), an XLR connector 24, a spring 26, an internal retaining ring 28, a support bracket 34, a screw 36, an XLR ground lug epoxy 42, and a wire 44.

The PC board assembly 10 of the phantom powered preamp 100 may include discrete transistors, resistors, capacitors, and/or diodes. The PC board assembly 10 may also include integrated circuits (e.g., op amps). A function of the integrated circuits may be to condition a high impedance output signal of the microphone 54, 56 to a low impedance. The PC board assembly 10 may also include additional amplification and/or conditioning circuitry suitable for the intended purpose and understood by one of ordinary skill in the art. As shown in FIG. 4, the PC board assembly 10 may extend from the housing base 30 to the preamp tip 32 of the phantom powered preamp 100.

The XLR connector 24 of the phantom powered preamp 100 may be a 3 pin male XLR connector. The XLR connector 24 may provide an interface to cabling, e.g., cabling to the power source. The XLR connector 24 may be an electrical connector found on professional audio, video, and stage lighting equipment. The XLR connector 24 may be circular in design and have between 3 and 7 connector pins. The XLR connector 24 may be associated with balanced audio interconnection, including AES3 digital audio, but may also be used for lighting control, low-voltage power supplies, and other applications. The XLR connector 24 may be available from a number of manufacturers and are covered by an international standard for dimensions, IEC 61076-2-103, incorporated herein by reference. The XLR connector may be any connector suitable for the intended purpose and understood by one of ordinary skill in the art.

The spring 26 of the phantom powered preamp 100 may carry a ground connection to the housing base 30 of the phantom powered preamp 100. The spring 26 may also be positioned in an interior region of the housing base 30 and proximate to an end closest to the preamp tip 32. The spring 26 may be made of metal or any other conductive material suitable for the intended purpose and understood by one of ordinary skill in the art.

The internal retaining ring 28 of the phantom powered preamp 100 may hold the PC board assembly 10, and all components attached thereto, in the housing base 30 and the preamp tip 32 of the phantom powered preamp 100. The internal retaining ring 28 may be made of plastic, rubber, a polymer, polyurethane, or any other material suitable for the intended purpose and understood by one of ordinary skill in the art.

The support bracket 34 of the phantom powered preamp 100 may support a narrow section of the PC board assembly 10 of the phantom powered preamp 100. The support bracket 34 may include at least two support brackets and be positioned within the housing base 30 and the preamp tip 32 of the phantom powered preamp 100. The at least two support brackets 34 may be positioned on a top and bottom surface of the PC board assembly 10 of the phantom powered preamp 100 to provide additional support to the PC board assembly 10.

The screw 36 of the phantom powered preamp 100 may be at least one screw that may affix the at least two support brackets of the support bracket 34 to the top and/or bottom surface of the PC board assembly 10 of the phantom powered preamp 100.

The XLR ground lug epoxy 42 of the phantom powered preamp 100 may securely hold a ground lug of the XLR connector 24 in place. The XLR ground lug epoxy 42 may be epoxy, glue, resin, or any other adhesive suitable for the intended purpose and understood by one of ordinary skill in the art.

The wire 44 of the phantom powered preamp 100 may electrically couple the XLR connector 24 to the PC board assembly 10 of the phantom powered preamp 100. The wire 44 may also be any type of connector suitable for the intended purpose and understood by one of ordinary skill in the art.

Figure 5:
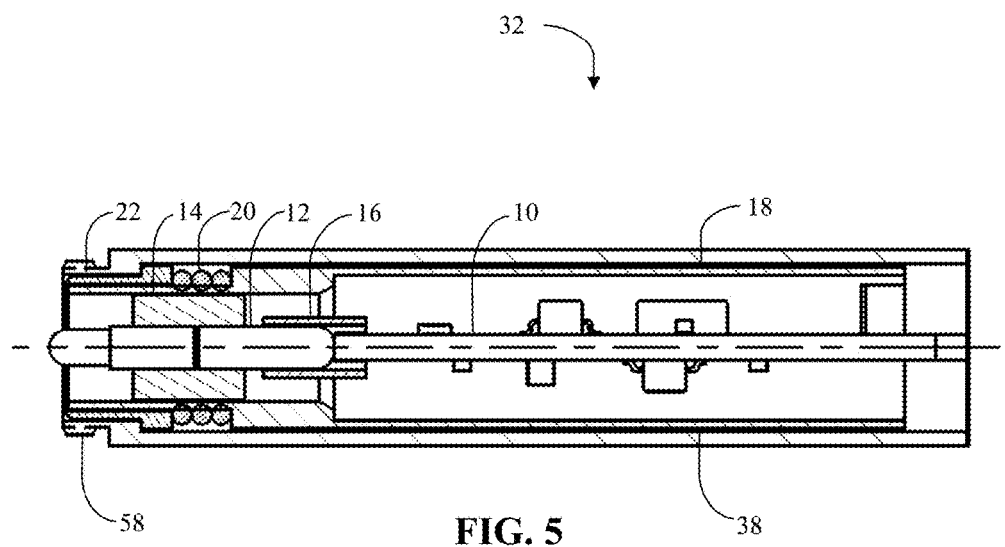
FIG. 5 is a cross-sectional view of a preamp tip of the phantom powered preamp.

As illustrated in FIG. 5, the preamp tip 32 of the phantom powered preamp 100 may include a pogo contact 12, an inner insulator 14, a pogo adapter 16, a guard tube 18, an O-ring 20, an outer insulator 22, a guard tube polyamide tape 38, a preamp tip epoxy 40, a screw epoxy 46, and a screw polyamide tape 48.

The pogo contact 12 and the pogo adapter 16 of the phantom powered preamp 100 may provide a signal connection between the microphone 54, 56 and the phantom powered preamp 100. For example, the pogo contact 12 may be a pogo pin that may be used in electronics to establish a connection (e.g., usually temporary) between the PC board assembly 10 and the microphone 54, 56. The pogo pin may be in the shape of a slender cylinder containing a spring-loaded pin. The pogo adapter 16 may be securely fastened to the PC board assembly 10, and the pogo contact 12 may be securely fastened to the pogo adapter 16, thereby electrically coupling the PC board assembly 10 to the microphone 45, 56.

The inner insulator 14 of the phantom powered preamp 100 may electrically insulate the pogo contact 12 from the guard tube 18 and may center the pogo contact 12. The outer insulator 22 of the phantom powered preamp 100 may electrically insulate the guard tube 18 from the preamp tip 32 and may center the guard tube 18. The inner insulator 14 and the outer insulator 22 may be made of any insulative material suitable for the intended purpose and understood by one of ordinary skill in the art.

The O-ring 20 of the phantom powered preamp 100 may decrease compliance and may be made of rubber, latex, polymer, or any other material suitable for the intended purpose and understood by one of ordinary skill in the art.

The guard tube polyamide tape 38 of the phantom powered preamp 100 may electrically insulate the guard tube 18 from the preamp tip 32 of the phantom powered preamp 100. The screw polyamide tape 48 of the phantom powered preamp 100 may secure the at least one screw 36 in place while the screw epoxy 46 is curing.

The preamp tip epoxy 40 of the phantom powered preamp 100 may permanently affix the housing base 30 to the preamp tip 32 of the phantom powered preamp 100. The screw epoxy 46 of the phantom powered preamp 100 may lock the at least one screw 36 into the support brackets 34 of the phantom powered preamp 100. The preamp tip epoxy 40 and the screw epoxy 46 may be epoxy, glue, resin, or any other adhesive suitable for the intended purpose and understood by one of ordinary skill in the art.

The phantom powered preamp 100 may be configured to be connectable to a ¼ inch converter 50 and a ½ inch converter 52. The ½ inch converter 52 may be generally cylindrical in shape. The ¼ inch converter 50 of the phantom powered preamp 100 may provide a smooth transition from the preamp tip 32 to the housing base 30 to reduce edge diffraction. The ½ inch converter 52 of the phantom powered preamp 100 may provide a smooth transition from the ½ inch microphone 56 to the housing base 30 to reduce edge diffraction. Users of the phantom powered preamp 100 may also leave the microphone 56 connected to the converter 52 to reduce wear on the microphone 52 thread.

The unique mechanical interface between the microphones 54, 56 (e.g., microphone cartridges) and the phantom powered preamp 100 may provide a method for mechanically adapting to different size microphones 54, 56 (e.g., ¼ inch and ½ inch) without using an adapter to connect to small, fine microphone threads. Connecting the microphones 54, 56 directly to the phantom powered preamp 100 may provide a stronger, more rugged connection and a more compact design because this does not change the overall length of the phantom powered preamp 100.

The guard tube 18 housed in the preamp tip 32 may reduce parasitic capacitance of the phantom powered preamp 100. The phantom powered preamp 100 may not need another guard to maintain low parasitic capacitance. The guard tube 18 of the phantom powered preamp 100 may be a metal tube surrounding an output node of the microphone 54, 56 driven by a low impedance source with a voltage signal equal in magnitude and phase to the output from the microphone 54, 56. This, in turn, eliminates the voltage across the stray capacitance at the input to the preamp tip 32, thereby negating its effect on the microphone 54, 56. The phantom powered preamp 100 may maintain the position of the microphone 54, 46 output node for different microphone cartridge 54, 56 sizes so that the guard tube 18 in the preamp tip 32 may be effective for all compatible microphones 54, 56. An illustration of the guard tube 18 is shown in FIG. 6.

Figure 6:
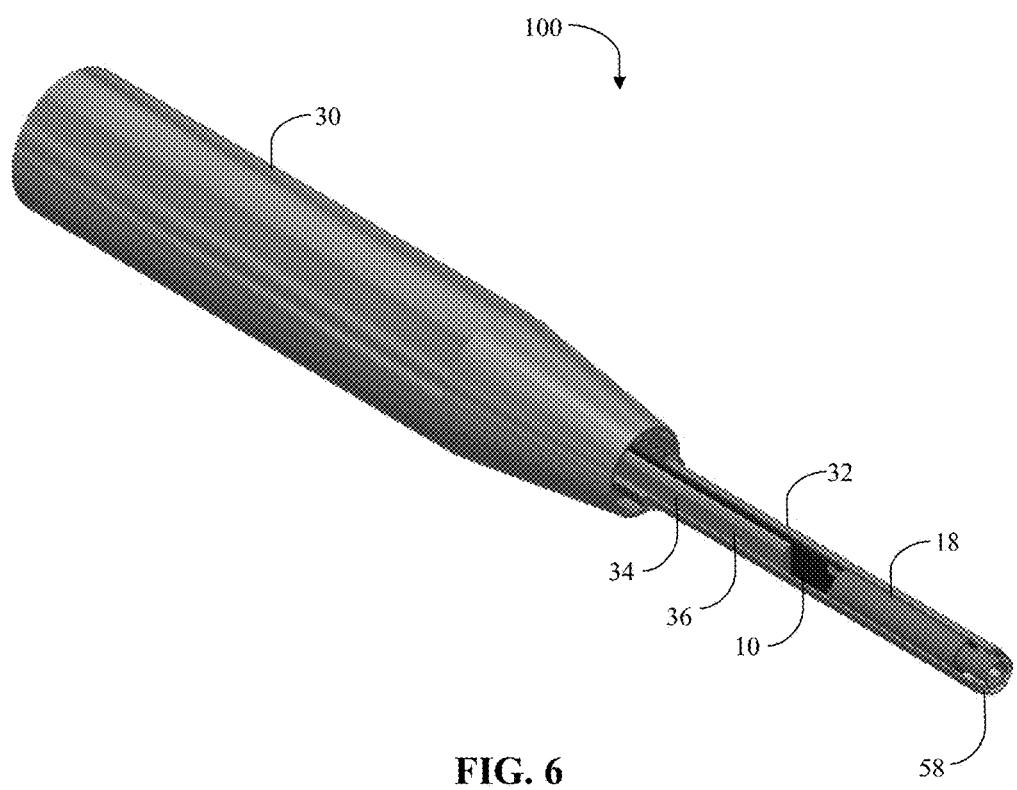
FIG. 6 is a perspective view of the phantom powered preamp and a partial cross-sectional view of the preamp tip and a guard tube of the phantom powered preamp.

As further illustrated in FIG. 6, the guard tube 18 of the phantom powered preamp 100 may be inside an elongated, generally cylindrical section of the phantom powered preamp 100. The guard tube 18 may be a conductive tube that encapsulates front end electronics. The guard tube 18 may be soldered to the PC board assembly 10 and may be the same electrical potential as the input voltage from the microphone 54, 56. This may reduce or eliminate parasitic capacitance in a preamplifier circuit path to optimize performance of the phantom powered preamp 100.

The phantom powered preamp 100 may further include threads 62 between the housing base 30 and the preamp tip 32. The threads 62 may also be on an exterior surface of the preamp tip 32 and approximate to a side of the preamp tip 32 that may be the closest to the housing base 30. The threads 62 of the phantom powered preamp 100 may not wear appreciably with repeated use.

Figure 3:
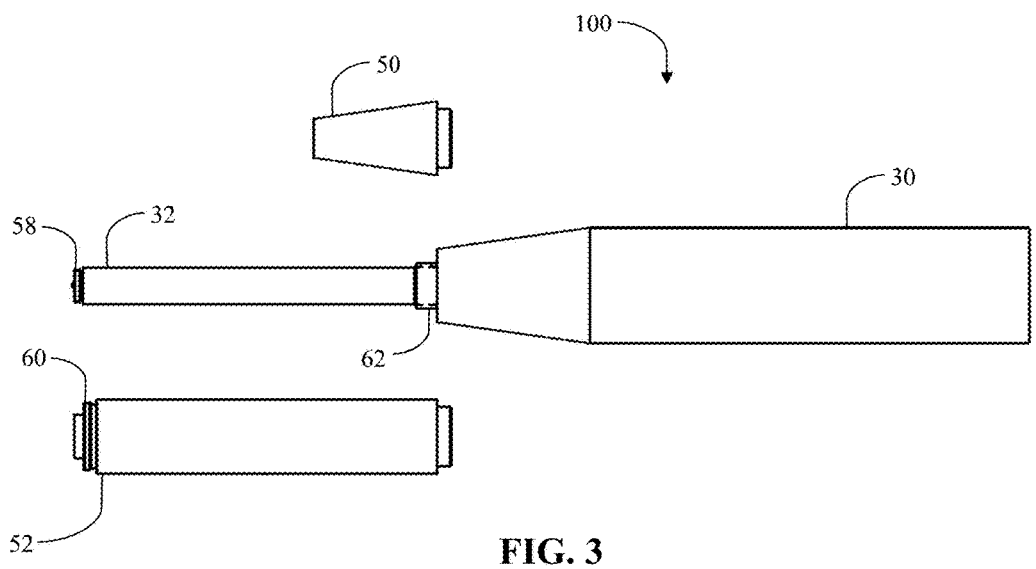
FIG. 3 is a side elevational view of the phantom powered preamp with a ½ inch converter and a ¼ inch converter.

FIG. 3 is a side elevational view of the phantom powered preamp 100 including the housing base 30. The housing base 30 of the phantom powered preamp 100 may be an elongated, generally cylindrical section. The preamp tip 32 of the phantom powered preamp 100 may receive the converter sections 50, 52. The distal end of the preamp tip 32 (e.g., leftmost portion of FIG. 3) may be a connector for an electrical connection to the microphone cartridge 54, 56. The distal end of the converter sections 50, 52 may provide a mechanical connection and be releasably engaged to the microphone cartridge 54, 56. For example, the microphone cartridge 54, 56 may be electrically coupled to the preamp tip 32 and mechanically coupled to the ½ inch converter 52.

Therefore, while the presently-preferred forms of the phantom powered preamp 100 have been shown and described, and several modifications discussed, persons skilled in this art will readily appreciate that various additional changes may be made without departing from the scope of the invention disclosed herein. For example, adaptation to other microphone sizes (e.g., 1 inch diameter microphones) and non-phantom powered preamp topologies, and mechanical adaptation to other preamp topologies (e.g., ICP®, multi-wire). Other mechanical interfaces to connect the converters to the housing (such as bayonet style, ball detents, double start threads, magnets).

The invention has been described in detail with particular reference to a present preferred embodiment, but it will be understood that variations and modifications can be effected within the spirit and scope of the invention. The presently disclosed embodiments are therefore considered in all respects to the illustrative and not restrictive. The scope of the invention is indicated by the appended claims, and all changes that come within the meaning and range of equivalents thereof are intended to be embraced therein.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

What is claimed is:

1. A phantom powered preamp for use with a microphone cartridge having a unique mechanical interface, the phantom powered preamp comprising:
   a housing base having a PC board assembly and a connector, the PC board assembly being electrically coupled to the connector;
   a preamp tip having an adapter and a guard tube, the PC board assembly extending from the housing base to the preamp tip and being electrically coupled to the adapter and the guard tube, the adapter being configured to be electrically coupled to the microphone cartridge, the guard tube being configured to surround a portion of the PC board assembly within the preamp tip; and
   a first converter being configured to releasably engage the preamp tip or the housing base to reduce edge diffraction.

2. The phantom powered preamp of claim 1, wherein the adapter is a pogo adapter.

3. The phantom powered preamp of claim 1, further comprising at least one support bracket connected to the PC board assembly.

4. The phantom powered preamp of claim 3, wherein the at least one support bracket is connected to the PC board assembly by at least one screw.

5. The phantom powered preamp of claim 1, wherein the guard tube is made of metal or an electrically conductive material.

6. The phantom powered preamp of claim 1, wherein the guard tube is further configured to surround the adapter of the preamp tip.

7. The phantom powered preamp of claim 1, wherein the preamp tip further includes a microphone interface.

8. The phantom powered preamp of claim 1, wherein the preamp tip further includes an inner insulator and an outer insulator, the inner insulator electrically insulating the adapter from the guard tube, the outer insulator electrically insulating the guard tube from the preamp tip.

9. The phantom powered preamp of claim 1, wherein the housing base further includes a spring, the spring being positioned at an opposite end of the connector of the housing base.

10. The phantom powered preamp of claim 9, wherein the spring is configured to carry a ground connection to the housing base.

11. The phantom powered preamp of claim 1, wherein the first converter is one of a ¼ inch converter and a ½ inch converter.

12. The phantom powered preamp of claim 11, wherein the ¼ inch converter tapers at an angle.

13. The phantom powered preamp of claim 12, wherein the housing base includes a distal end and a proximal end, the distal end of the housing base sloping at an angle forming a tapered distal end.

14. The phantom powered preamp of claim 13, wherein the angle of the ¼ inch converter and the angle of the distal end of the housing base are approximately the same angle.

15. The phantom powered preamp of claim 1, wherein a distal end of the first converter is configured to be releasably engaged to the microphone cartridge.

16. The phantom powered preamp of claim 1, wherein the preamp tip includes a distal end and a proximal end, the proximal end of the preamp tip being proximate to the housing base, the proximal end of the preamp tip including threads for receiving the first converter.

17. The phantom powered preamp of claim 1, wherein the first converter has a distal end having a first diameter, further comprising a second converter having a distal end having a second diameter greater than the first diameter, wherein the first converter and the second converter are configured to interchangeably engage the preamp tip.

18. The phantom powered preamp converter of claim 1, wherein the housing base and the preamp tip are a unitary structure.

19. A phantom powered preamp for use with a microphone cartridge having a unique mechanical interface, the phantom powered preamp comprising:
- a housing base having a PC board assembly and a connector, the PC board assembly being electrically coupled to the connector;
- a preamp tip having an adapter and a guard tube, the PC board assembly extending from the housing base to the preamp tip and being electrically coupled to the adapter and the guard tube, the adapter being configured to be electrically coupled to the microphone cartridge, the guard tube being configured to surround a portion of the PC board assembly within the preamp tip, wherein the housing base and the preamp tip are a unitary structure; and
- a mechanical converter being configured to releasably engage the preamp tip or the housing base to reduce edge diffraction.

20. A phantom powered preamp for use with a microphone cartridge having a unique mechanical interface, the phantom powered preamp comprising:
- a housing base having a PC board assembly and a connector, the PC board assembly being electrically coupled to the connector;
- a preamp tip having an adapter and a guard tube, the PC board assembly extending from the housing base to the preamp tip and being electrically coupled to the adapter and the guard tube, the adapter being configured to be electrically coupled to the microphone cartridge, the guard tube being configured to surround a portion of the PC board assembly within the preamp tip;
- a first converter having a distal end having a first diameter; and
- a second converter having a distal end having a second diameter greater than the first diameter of the first converter, the first converter and the second converter being configured to interchangeably engage the preamp tip or the housing base.

* * * * *